(12) United States Patent
Jung et al.

(10) Patent No.: US 8,194,485 B2
(45) Date of Patent: Jun. 5, 2012

(54) SEMICONDUCTOR MEMORY DEVICE AND METHOD OF CONTROLLING SENSE AMPLIFIER OF SEMICONDUCTOR MEMORY DEVICE

(75) Inventors: Sang-Hoon Jung, Masan-si (KR); Jae-Youn Youn, Seoul (KR); Young-Sun Min, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 140 days.

(21) Appl. No.: 12/552,615

(22) Filed: Sep. 2, 2009

(65) Prior Publication Data
US 2010/0067317 A1   Mar. 18, 2010

(30) Foreign Application Priority Data
Sep. 17, 2008   (KR) .......................... 10-2008-0091096

(51) Int. Cl.
*G11C 7/02* (2006.01)
(52) U.S. Cl. .......................... 365/207; 365/222; 365/205
(58) Field of Classification Search .................. 365/207, 365/222, 205, 51, 230.03, 63, 189.05, 203, 365/202, 189.09, 189.07, 189.11
See application file for complete search history.

(56) References Cited

U.S. PATENT DOCUMENTS

| 6,859,405 | B2 | 2/2005 | Lee et al. | |
| 7,298,655 | B2* | 11/2007 | Choi et al. | 365/189.011 |
| 2005/0157574 | A1* | 7/2005 | Komura et al. | 365/203 |
| 2005/0190625 | A1* | 9/2005 | Matsuzaki | 365/222 |
| 2008/0144414 | A1* | 6/2008 | Lee et al. | 365/205 |

FOREIGN PATENT DOCUMENTS

| KR | 1020030000844 | 1/2003 |
| KR | 1020040055864 | 6/2004 |
| KR | 1020060134601 | 12/2006 |

* cited by examiner

*Primary Examiner* — Dang Nguyen
(74) *Attorney, Agent, or Firm* — Volentine & Whitt, PLLC

(57) ABSTRACT

A semiconductor memory device includes at least one sense amplifier, a controller and a sense amplifier driver. The sense amplifier includes a PMOS sense amplifier and an NMOS sense amplifier configured to be respectively activated in response to a first supply voltage and a second supply voltage, and to sense and amplify a voltage difference between a corresponding bit line pair. The controller is configured to set an operating mode in response to an external command, to control activation timing of a PMOS drive activation signal and an NMOS drive activation signal according to the set operating mode, and to output the PMOS drive activation signal and the NMOS drive activation signal. The sense amplifier driver is configured to apply the first and second supply voltages to the PMOS and NMOS sense amplifiers, respectively, in response to the PMOS drive activation signal and the NMOS drive activation signal.

15 Claims, 5 Drawing Sheets

SEMICONDUCTOR MEMORY DEVICE AND METHOD OF CONTROLLING SENSE AMPLIFIER OF SEMICONDUCTOR MEMORY DEVICE

PRIORITY CLAIM

A claim of priority is made to Korean Patent Application No. 10-2008-0091096, filed Sep. 17, 2008, in the Korean Intellectual Property Office, the subject matter of which is hereby incorporated by reference.

SUMMARY

Various embodiments relate to a semiconductor device, and more particularly, to a semiconductor memory device configured to control sensing timing of a sense amplifier in different ways according to an operating mode, and a method of controlling the sense amplifier of the semiconductor memory device.

A semiconductor memory device includes sense amplifiers in order to sense and amplify data stored in memory cells. The sense amplifiers are generally required to have high sensitivity, low power consumption and small size, and to operate at high speeds. Such sense amplifiers may be implemented in various ways. However, (complementary metal-oxide semiconductor) CMOS sense amplifiers are currently used, which are constructed by coupling an NMOS sense amplifier and a PMOS sense amplifier.

According to illustrative embodiments, there is provided a semiconductor memory device including at least one sense amplifier, a controller and a sense amplifier driver. The sense amplifier includes a PMOS sense amplifier and an NMOS sense amplifier configured to be respectively activated in response to a first supply voltage and a second supply voltage, and to sense and amplify a voltage difference between a corresponding bit line pair. The controller is configured to set an operating mode in response to an external command, to control activation timing of a PMOS drive activation signal and an NMOS drive activation signal according to the set operating mode, and to output the PMOS drive activation signal and the NMOS drive activation signal. The sense amplifier driver is configured to apply the first and second supply voltages to the PMOS and NMOS sense amplifiers, respectively, in response to the PMOS drive activation signal and the NMOS drive activation signal.

The controller may activate a sensing enable signal when the operating mode is a normal read mode, and may activate the sensing enable signal and a self-refresh enable signal when the operating mode is a self-refresh mode.

The controller may include a sense amplifier controller. The sense amplifier controller may be configured to adjust the activation timing of the PMOS drive activation signal and the NMOS drive activation signal, and to output the PMOS drive activation signal and the NMOS drive activation signal in response to the sensing enable signal and the self-refresh enable signal.

The sense amplifier controller may include PMOS and NMOS drive activation signal generators. They PMOS drive activation signal generator may be configured to activate the PMOS drive activation signal in response to the sensing enable signal and the self-refresh enable signal. The NMOS drive activation signal generator may be configured to activate the NMOS drive activation signal in response to the sensing enable signal and the self-refresh enable signal.

The sense amplifier controller may activate the PMOS drive activation signal before the NMOS drive activation signal when the sensing enable signal is activated and the self-refresh enable signal is inactivated. Also, the sense amplifier controller may activate the NMOS drive activation signal before the PMOS drive activation signal when both the sensing enable signal and the self-refresh enable signal are activated.

The sense amplifier controller may activate the PMOS drive activation signal before the NMOS drive activation signal when the sensing enable signal is activated and the self-refresh enable signal is inactivated. Also, the sense amplifier controller may simultaneously activate both the PMOS drive activation signal and the NMOS drive activation signal when both the sensing enable signal and the self-refresh enable signal are activated.

The sense amplifier controller may simultaneously inactivate both the PMOS drive activation signal and the NMOS drive activation signal when the sensing enable signal is inactivated.

The sense amplifier driver may include PMOS and NMOS drive transistors. The PMOS drive transistors may be configured to apply the first supply voltage to the PMOS sense amplifier in response to the PMOS drive activation signal. The NMOS drive transistors may be configured to apply the second supply voltage to the NMOS sense amplifier in response to the NMOS drive activation signal.

The semiconductor memory device may further include a memory cell array. The memory cell array may have memory cells that are arranged between bit line pairs and between word lines.

According to other illustrative embodiments, there is provided a method of controlling a sense amplifier of a semiconductor memory device including at least one sense amplifier. The at least one sense amplifier includes a PMOS sense amplifier and an NMOS sense amplifier configured to be respectively activated when a first supply voltage and a second supply voltage are applied to sense and amplify a voltage difference between a corresponding bit line pair. The method includes setting an operating mode in response to an external command; controlling activation timing of a PMOS drive activation signal and an NMOS drive activation signal according to the set operating mode; and driving the sense amplifier by respectively applying the first and second supply voltages to the PMOS sense amplifier and the NMOS sense amplifier in response to the PMOS drive activation signal and the NMOS drive activation signal.

BRIEF DESCRIPTION OF THE DRAWINGS

Various embodiments will be described in further detail with reference to the attached drawings, in which various aspects of the drawings may have been exaggerated for clarity.

DETAILED DESCRIPTION OF THE EMBODIMENTS

Figure 1:
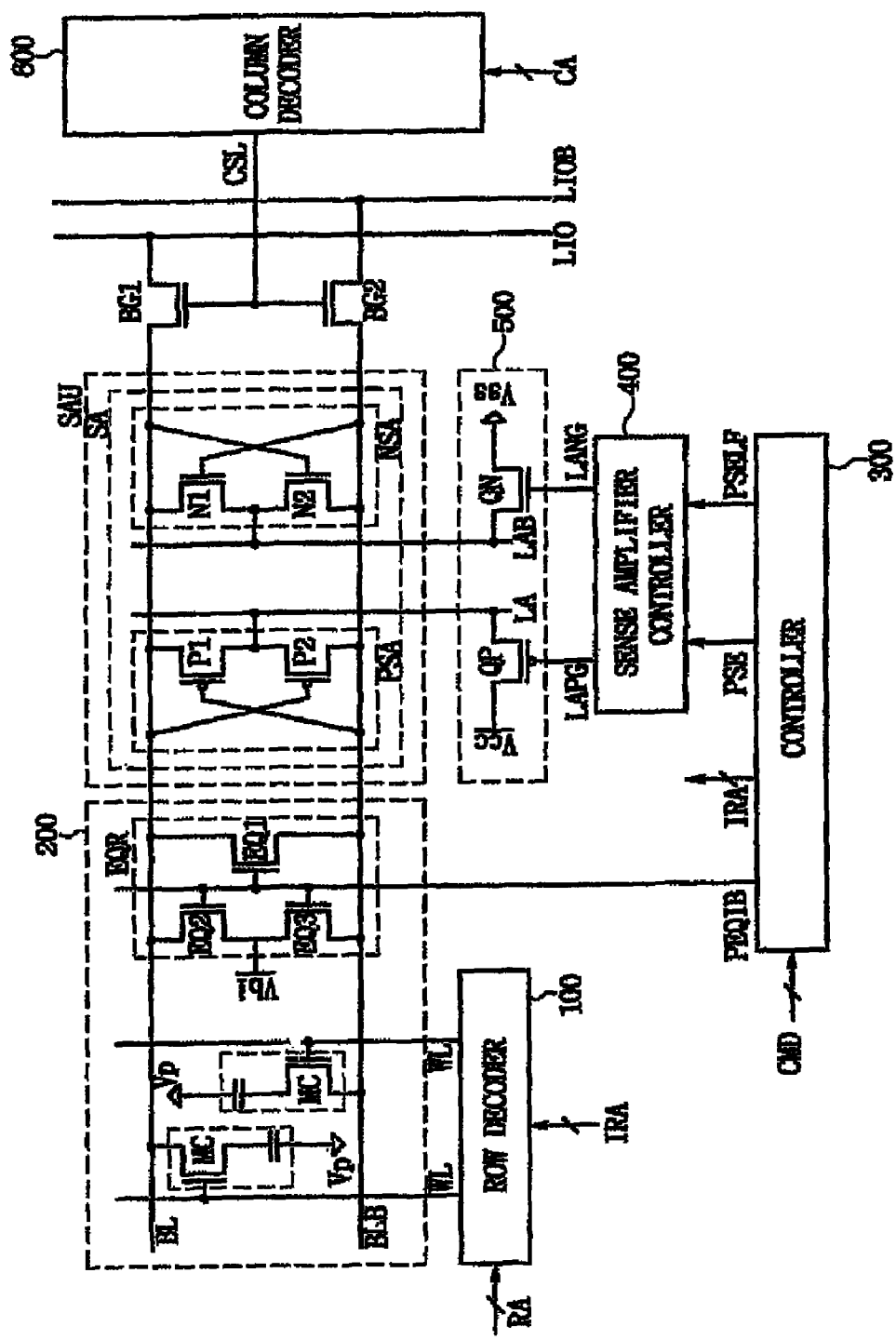
FIG. 1 is a block diagram showing a semiconductor memory device, according to an illustrative embodiment.

Embodiments of a semiconductor memory device, which can control sensing timing of a sense amplifier differently according to an operating mode, and a method of controlling a sense amplifier of the semiconductor memory device, are described more fully with reference to the accompanying drawings below. The inventive concept, however, may be embodied in various different forms, and should not be construed as being limited only to the illustrated embodiments. Rather, these embodiments are provided as examples, to convey the concept to one skilled in the art. Accordingly, known processes, elements, and techniques are not described with respect to some of the embodiments. Throughout the drawings and written description, like reference numerals will be used to refer to like or similar elements.

FIG. 1 is a block diagram showing a semiconductor memory device, according to an illustrative embodiment.

A row decoder 100 receives a row address RA from an address register (not shown) that receives an external address, decodes the row address RA, and activates a predetermined number of word lines WL (for example, one word line WL) selected from among multiple word lines WL in a memory cell array 200 using decoded row address RA.

The memory cell array 200 includes multiple bit line pairs BL and BLB, multiple word lines WL, and multiple memory cells MC. The memory cells MC are arranged between bit line pairs BL and BLB and between word lines WL. When the semiconductor memory device is a Dynamic Random Access Memory (DRAM) device, each of the memory cells MC is generally constructed using a single cell transistor and a single cell capacitor and stores data "1" or "0." Further, bit line precharging units EQR are arranged between the respective bit line pairs BL and BLB. Each of the bit line precharging units EQR includes three equalization transistors EQ1 to EQ3 that are configured to precharge the bit line pairs BL and BLB to a bit line precharge voltage Vbl in response to an equalization signal PEQIB received from a controller 300. A bit line precharge voltage (Vbl) level may be changed depending on the configuration of a sense amplifier SA. Generally, the bit line precharge voltage (Vbl) level is about half of a first supply voltage (Vcc) level, for example.

The controller 300 outputs a sensing enable signal PSE and a self-refresh enable signal PSELF in response to a received external command CMD. The sensing enable signal PSE is activated in normal read mode and the self-refresh enable signal PSELF is activated in self-refresh mode.

A sense amplifier controller 400 outputs a PMOS drive activation signal LAPG that is used to activate a PMOS drive transistor QP, and an NMOS drive activation signal LANG that is used to activate an NMOS drive transistor QN, in response to both the sensing enable signal PSE and the self-refresh enable signal PSELF. In the normal read mode, the sense amplifier controller 400 activates and outputs the PMOS drive activation signal LAPG before the NMOS drive activation signal LANG. In contrast, in the self-refresh mode, the sense amplifier controller 400 simultaneously activates and outputs both the PMOS drive activation signal LAPG and the NMOS drive activation signal LANG, or activates and outputs the NMOS drive activation signal LANG before the PMOS drive activation signal LAPG. The sense amplifier controller 400 is shown in FIG. 1 as being a separate block. However, the semiconductor device may be configured such that the sense amplifier controller 400 is included in the controller 300, for example.

A sense amplifier driver 500 includes the PMOS drive transistor QP and the NMOS drive transistor QN. The PMOS drive transistor QP supplies a first supply voltage Vcc to a sense amplifier power line LA in response to the PMOS drive activation signal LAPG, thus activating a PMOS sense amplifier PSA. The NMOS drive transistor QN supplies a second supply voltage Vss to an inverted sense amplifier power line LAB in response to the NMOS drive activation signal LANG, thus activating an NMOS sense amplifier NSA.

In the normal read mode, the sense amplifier controller 400 activates the PMOS drive activation signal LAPG before the NMOS drive activation signal LANG, as described above. Accordingly, the PMOS drive transistor QP is activated before the NMOS drive transistor, so that the first supply voltage Vcc is supplied to the PMOS sense amplifier PSA before the second supply voltage Vss is supplied to the NMOS sense amplifier NSA via the NMOS drive transistor QN. Further, in the self-refresh mode, the sense amplifier controller 400 simultaneously activates the PMOS drive activation signal LAPG and the NMOS drive activation signal LANG, or activates the NMOS drive activation signal LANG before the PMOS drive activation signal LAPG, as described above. Accordingly, the first supply voltage Vcc and the second supply voltage Vss are respectively supplied to the PMOS sense amplifier PSA and the NMOS sense amplifier NSA when both the PMOS drive transistor QP and the NMOS drive transistor QN are simultaneously activated, or the second supply voltage Vss is supplied to the NMOS sense amplifier NSA before the first supply voltage Vcc is supplied to the PMOS sense amplifier PSA when the NMOS drive transistor QN is activated before the PMOS drive transistor QP.

A sense amplifier unit SAU includes at least one sense amplifier SA. Each sense amplifier SA includes a PMOS sense amplifier PSA and an NMOS sense amplifier NSA, discussed above, in order to sense and amplify the voltage difference generated between the bit line pair BL and BLB due to data stored in the memory cell MC. The PMOS sense amplifier PSA pulls one of the bit line pairs BL and BLB that is connected with a memory cell MC in which data "1" is stored up to the first supply voltage (Vcc) level. The NMOS sense amplifier NSA pulls one of the bit line pairs BL and BLB that is connected with a memory cell MC in which data "0" is stored down to a second supply voltage (Vss) level. That is, the sense amplifier SA senses the voltage difference that is generated between the bit lines BL and BLB due to data stored in the memory cell MC, and amplifies the sensed voltage difference to the first supply voltage (Vcc) level and the second supply voltage (Vss) level.

A column decoder 600 receives a column address CA from the address register (not shown), which receives the external address, and selects and activates a corresponding column selection line CSL by decoding the column address CA. When the corresponding column selection line CSL is activated, two bit line gates BG1 and BG2 are activated. The activated bit line gates BG1 and BG2 connect the respective bit lines BL and BLB with a local input/output line pair LIO and LIOB, and thus data amplified by the sense amplifier SA can be transmitted to the local input/output line pair LIO and LIOB.

Operation of the semiconductor memory device, according to an illustrative embodiment is described below with reference to FIG. 1. In the normal read mode, when an external address and an external read command CMD are received, an address register (not shown) divides the external address into a row address RA and a column address CA, and outputs the row address RA and the column address CA to the row decoder 100 and the column decoder 600, respectively. In this case, the controller 300 activates the sensing enable signal PSE.

The row decoder 100 decodes the row address RA, thereby selecting and activating a predetermined number of word lines WL from among the word lines WL of the memory cell array 200. Voltage differences are generated between the bit line pairs BL and BLB due to data stored in memory cells MC connected to the activated word lines WL.

The sense amplifier controller 400 first outputs the PMOS drive activation signal LAPG in response to the activated sense amplifier enable signal PSE, and then outputs the NMOS drive activation signal LANG. The PMOS drive transistor QP pulls up the sense amplifier power line LA to the first supply voltage (Vcc) level in response to the PMOS drive activation signal LAPG that is first applied to the sense amplifier driver 500. The NMOS drive transistor QN pulls down the inverted sense amplifier power line LAB to the second supply voltage (Vss) level in response to the subsequent NMOS drive activation signal LANG.

The PMOS sense amplifier PSA is activated as the sense amplifier power line LA is pulled up to the first supply voltage (Vcc) level, while the NMOS sense amplifier NSA is activated as the inverted sense amplifier power line LAB is pulled down to the second supply voltage (Vss) level. The PMOS sense amplifier PSA, which is activated before the NMOS sense amplifier NSA, senses the voltage difference between a bit line pair BL and BLB, and pulls up the bit line pair BL and BLB connected with a memory cell MC in which data "1" is stored to the first supply voltage (Vcc) level. Subsequently, the NMOS sense amplifier senses the voltage difference between a bit line pair BL and BLB, and pulls down the bit line pair BL and BLB connected with a memory cell MC in which data "0" is stored to the second supply voltage (Vss) level. Generally, the operating speed in the normal read mode is determined by tRCD (RAS to CAS delay time), and the sensing operating speed of the PMOS sense amplifier PSA is slower than that of the NMOS sense amplifier NSA. Accordingly, when the sensing operation of the PMOS sense amplifier PSA is performed ahead of the sensing operation of the NMOS sense amplifier, a tRCD characteristic can be improved.

After the sense amplifier SA amplifies the voltage levels of the bit line pair BL and BLB to the first supply voltage (Vcc) level and the second supply voltage (Vss) level, respectively, the column decoder 600 activates the column selection line CSL by decoding the column address CA. The bit line gates BG1 and BG2 are activated due to the activation of the column selection line CSL, thus connecting the bit line pair BL and BLB to the local input/output line pair LIO and LIOB. In this case, the voltages of the bit line pair BL, BLB amplified by the sense amplifier SA are applied to the respective local input/output line pair LIO and LIOB.

Further, when the controller 300 outputs the equalization signal PEQIB, the equalization transistors EQ1 to EQ3 of the bit line precharging unit EQR precharge the bit line pair BL and BLB to the bit line precharge voltage Vbl.

In the normal read mode, the tRCD characteristic is improved when the sensing operation of the PMOS sense amplifier PSA is performed ahead of the sensing operation of the NMOS sense amplifier NSA. However, in the self-refresh mode, the amount of charge stored in the memory cell MC decreases due to leakage current, so that a decreased voltage difference is generated between the bit line pair BL and BLB. Therefore, if the sensing operation of the PMOS sense amplifier PSA were performed ahead of the sensing operation of the NMOS sense amplifier NSA, the probability of erroneously sensing data may be increased. Accordingly, in the self-refresh mode, when the NMOS sense amplifier NSA is operated before the PMOS sense amplifier PSA, or when both the PMOS sense amplifier PSA and the NMOS sense amplifier NSA are simultaneously operated, the self-refresh characteristic of the semiconductor memory device is improved.

More particularly, when an external self-refresh command CMD is received, the controller 300 activates the self-refresh enable signal PSELF, and then generates internal row addresses IRA and outputs them to the row decoder 100. Further, the controller 300 activates the sensing enable signal PSE when the internal row addresses IRA are generated. The row decoder 100 decodes the internal row addresses IRA, thereby selecting and activating a predetermined number of word lines WL from among the word lines WL of the memory cell array 100. Voltage differences are generated between the bit line pairs BL and BLB due to data stored in memory cells MC connected to the respective activated word lines WL.

The sense amplifier controller 400 simultaneously outputs both the PMOS drive activation signal LAPG and the NMOS drive activation signal LANG in response to the activated self-refresh enable signal PSELF and an activated sensing enable signal PSE. The PMOS drive transistor QP and NMOS drive transistor QN of the sense amplifier driver 500 simultaneously pull the respective sense amplifier power lines LA and LAB up and down to the first supply voltage (Vcc) level and the second supply voltage (Vss) level, respectively, in response to both the PMOS drive activation signal LAPG and the NMOS drive activation signal LANG. Alternatively, the sense amplifier controller 400 outputs the PMOS drive activation signal LAPG after outputting the NMOS drive activation signal LANG, in which case, the PMOS drive transistor QP pulls up the sense amplifier power line LA to the first supply voltage (Vcc) level after the NMOS drive transistor QN pulls down the inverted sense amplifier power line LAB to the second supply voltage (Vss) level.

The PMOS sense amplifier PSA is activated as the sense amplifier power line LA is pulled up to the first supply voltage (Vcc) level, and the NMOS sense amplifier NSA is activated as the inverted sense amplifier power line LAB is pulled down to the second supply voltage (Vss) level. Consequently, the voltage differences between the bit line pairs BL and BLB are sensed and amplified. Accordingly, the memory cells MC can be refreshed by data.

Figure 2:
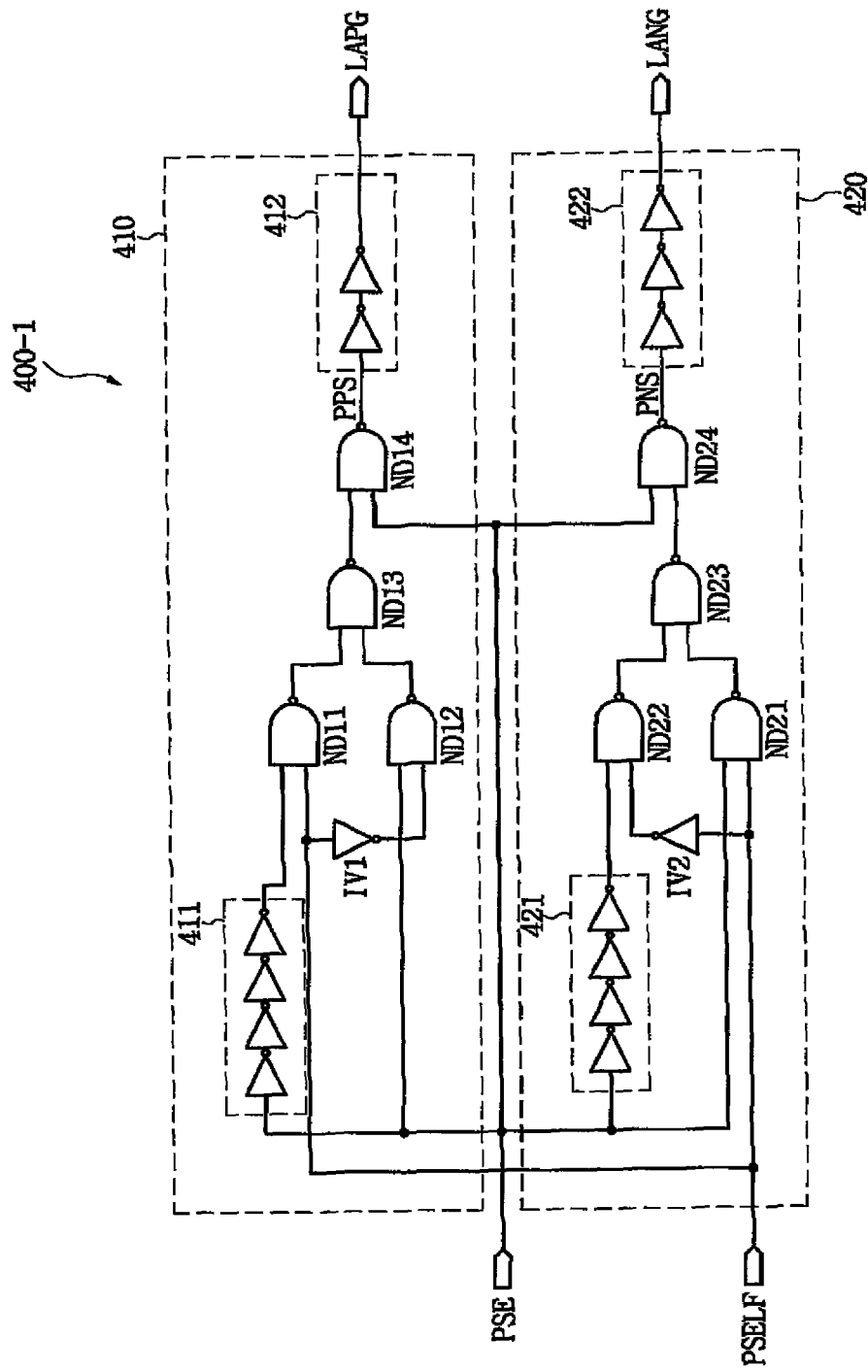
FIG. 2 is a circuit diagram showing an example of a sense amplifier controller shown in FIG. 1, according to an illustrative embodiment.

FIG. 2 is a circuit diagram showing an example of the sense amplifier controller shown in FIG. 1, according to an embodiment.

The sense amplifier controller 400-1 includes a PMOS drive activation signal generator 410 configured to output the PMOS drive activation signal LAPG, and an NMOS drive activation signal generator 420 configured to output the NMOS drive activation signal LANG. The PMOS drive activation signal generator 410 includes a delay unit 411, an inverter IV1, four NAND gates ND11 to ND14, and a buffer unit 412. The delay unit 411 includes multiple delay elements, indicated by four representative delay elements for purposes of illustration. The delay unit 411 receives the sensing enable signal PSE, and delays and outputs the received sensing enable signal PSE. The NAND gate ND11 performs a NAND operation on an output signal of the delay unit 411 and the self-refresh enable signal PSELF. The inverter IV1 inverts the self-refresh enable signal PSELF, thereby generating an inverted self-refresh enable signal PSELF. The NAND gate ND12 performs a NAND operation on the inverted self-refresh enable signal PSELF and the sensing enable signal PSE. The NAND gate ND13 performs a NAND operation on output signals of the NAND gates ND11 and ND12. The NAND gate ND14 performs a NAND operation on an output signal of the NAND gate ND13 and the sensing enable signal PSE, and outputs a PMOS sensing enable signal PPS. The buffer unit 412 buffers the PMOS sensing enable signal PPS, thereby generating the PMOS drive activation signal LAPG.

Further, the NMOS drive activation signal generator 420 includes a delay unit 421, an inverter IV2, four NAND gates ND21 to ND24, and a buffer unit 422. The delay unit 421 includes multiple delay elements, indicated by four representative delay elements for purposes of illustration. The delay unit 421 receives the sensing enable signal PSE, and delays and outputs the received sensing enable signal PSE. The NAND gate ND21 performs a NAND operation on the self-refresh enable signal PSELF and the sensing enable signal PSE. The inverter IV2 inverts the self-refresh enable signal PSELF, thereby generating an inverted self-refresh enable signal PSELF. The NAND gate ND22 performs a NAND operation on the output signal of the delay unit 421 and the inverted self-refresh enable signal PSELF. The NAND gate ND23 performs a NAND operation on output signals of the NAND gates ND21 and ND22. The NAND gate ND24 performs a NAND operation on an output signal of the NAND gate ND23 and the sensing enable signal PSE, thereby generating an NMOS sensing enable signal PNS. The buffer unit 422 buffers and inverts the NMOS sensing enable signal PNS, thereby generating the NMOS drive activation signal LANG. Here, if the drivability of the PMOS drive activation signal LAPG and the NMOS drive activation signal LANG must be increased to ensure proper driving of the PMOS drive transistor QP and the NMOS drive transistor QN, additional buffers that have high drivability may be provided in the buffer units 412 and 422.

Figure 3:
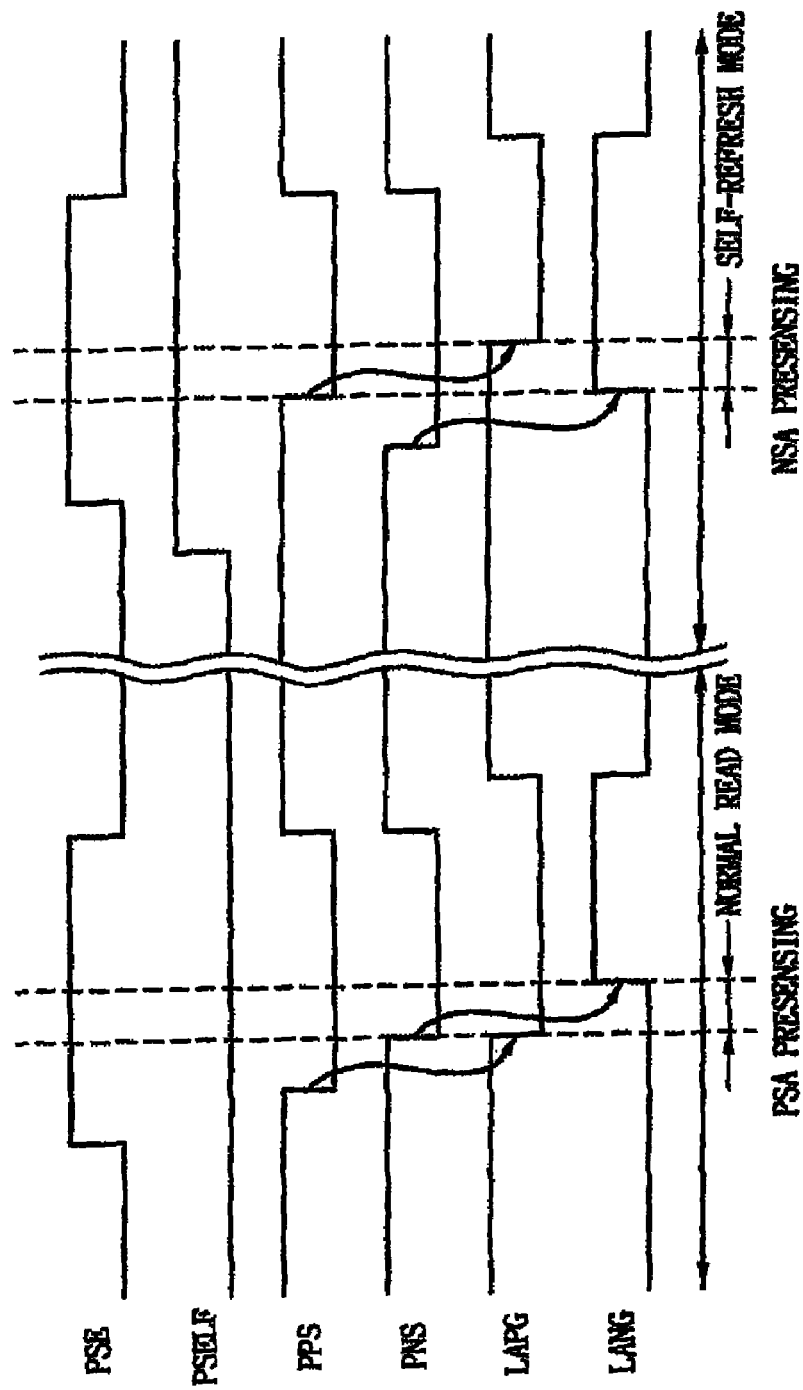
FIG. 3 is a timing diagram illustrating operation of the sense amplifier controller shown in FIG. 2, according to an illustrative embodiment.

FIG. 3 is a timing diagram illustrating operation of the sense amplifier controller shown in FIG. 2, according to an illustrative embodiment. In the normal read mode, the sensing enable signal PSE is activated, while the self-refresh enable signal PSELF is inactivated. When the sensing enable signal PSE is activated to a high level, each of the NAND gates ND12 and ND21 receives the high-level sensing enable signal PSE. In this case, the output signal of the NAND gate ND21 is kept at a high level by a low-level self-refresh enable signal PSELF, while the output signal of the NAND gate ND12 is changed to a low-level signal by an inverted self-refresh enable signal PSELF and the high-level sensing enable signal PSE. Thereafter, when the high-level sensing enable signal PSE is delayed by the delay units 411 and 421 and then applied to each of the NAND gates ND11 and ND22, the output signal of the NAND gate ND11 is kept at a high level by a low-level self-refresh enable signal PSELF, while the output signal of the NAND gate ND22 is delayed by the inverted self-refresh enable signal PSELF and the high-level delayed sensing enable signal PSE, and is changed to a low-level signal.

The NAND gate ND13 outputs a high-level signal in response to the output signals of the NAND gates ND11 and ND12, and then the NAND gate ND14 outputs a low-level PMOS sensing enable signal PPS in response to the output signal of the NAND gate ND13 and the sensing enable signal PSE. Also, the NAND gate ND23 outputs a high-level delayed signal in response to the output signals of the NAND gates ND21 and ND22, and then the NAND gate ND24 outputs a low-level delayed NMOS sensing enable signal PNS in response to the output signal of the NAND gate ND23 and the sensing enable signal PSE. That is, after the PMOS sensing enable signal PPS is first changed from a high-level signal to a low-level signal, the NMOS sensing enable signal PNS is changed from a high-level signal to a low-level signal following the delay time of the delay unit 421.

The buffer unit 412 buffers the low-level PMOS sensing enable signal PPS, thereby generating a low-level PMOS drive activation signal LAPG. The buffer unit 422 buffers and inverts the low-level NMOS sensing enable signal PNS, thereby generating a high-level NMOS drive activation signal LANG.

As a result, in the normal read mode, the PMOS drive activation signal LAPG is first activated (to a low level), and then the NMOS drive activation signal LANG is activated (to a high level) after the delay time of the delay unit 421 has elapsed. Accordingly, in the sense amplifier SA, the PMOS sense amplifier PSA first performs the sensing operation and then the NMOS sense amplifier NSA performs the sensing operation, creating the presensing period of the PMOS sense amplifier PSA.

When the sensing enable signal PSE is inactivated to a low level after the read operation is completed, the output signal of the NAND gate ND21 is kept at a high level by a low-level self-refresh enable signal PSELF, while the output signal of the NAND gate ND12 is changed to a high-level signal by an inverted self-refresh enable signal PSELF and the low-level sensing enable signal PSE. Thereafter, when the low-level sensing enable signal PSE is delayed by the delay units 411 and 421 and applied to each of the NAND gates ND11 and ND22, the output signal of the NAND gate ND11 is kept at a high level by the low-level self-refresh enable signal PSELF, while the output signal of the NAND gate ND22 is delayed by the inverted self-refresh enable signal PSELF and the low-level delayed sensing enable signal PSE, and is changed to a high-level signal.

The NAND gate ND13 outputs a low-level signal in response to the output signals of the NAND gates ND11 and ND12, and then the NAND gate ND14 outputs a high-level PMOS sensing enable signal PPS in response to the output signal of the NAND gate ND13 and the sensing enable signal PSE. Also, the NAND gate ND23 outputs a low-level delayed signal in response to the output signals of the NAND gates ND21 and ND22, and then the NAND gate ND24 outputs a high-level NMOS sensing enable signal PNS in response to the output signal of the NAND gate ND23 and the sensing enable signal PSE. Accordingly, when the read operation is terminated, both the PMOS sensing enable signal PPS and the NMOS sensing enable signal PNS are simultaneously inactivated to a high level.

The buffer unit 412 buffers the high-level PMOS sensing enable signal PPS, thereby generating a high-level PMOS drive activation signal LAPG. The buffer unit 422 buffers and inverts the high-level NMOS sensing enable signal PNS, thereby generating a low-level NMOS drive activation signal LANG.

In the self-refresh mode, the self-refresh enable signal PSELF is activated to a high level, and then the sensing enable signal PSE is activated to a high level. Accordingly, the sensing enable signal PSE is initially kept at a low level even though the self-refresh enable signal PSELF is activated to a high level, so that all of the output signals of the NAND gates ND11, ND12, ND21 and ND22 are kept at a high level. The outputs signals of the NAND gates ND11, ND12, ND21 and ND22 are kept at the same level, so that both the PMOS sensing enable signal PPS and the NMOS sensing enable signal PNS are kept at a high level, resulting in the PMOS drive activation signal LAPG being kept at a high level and the NMOS drive activation signal LANG being kept at a low level.

When the sensing enable signal PSE is then activated to a high level, each of the NAND gates ND12 and ND21 receives the high-level sensing enable signal PSE. In this case, the output signal of the NAND gate ND12 is kept at the high level by a self-refresh enable signal PSELF inverted by the inverter IV1, while the output signal of the NAND gate ND21 is changed to a low-level signal by the high-level self-refresh enable signal PSELF and the high-level sensing enable signal PSE. Thereafter, when the high-level sensing enable signal PSE is delayed by the delay units 411 and 412 and then applied to each of the NAND gates ND11 and ND22, the output signal of the NAND gate ND22 is kept at a high level by a low-level inverted self-refresh enable signal PSELF, while the output signal of the NAND gate ND11 is delayed by the high-level self-refresh enable signal PSELF and the high-level delayed sensing enable signal PSE, and is changed into a low-level signal.

The NAND gate ND23 outputs a high-level signal in response to the output signals of the NAND gates ND21 and ND22, and then the NAND gate ND24 outputs a low-level NMOS sensing enable signal PNS in response to the output signal of the NAND gate ND23 and the sensing enable signal PSE. Also, the NAND gate ND13 outputs a high-level delayed signal in response to the output signals of the NAND gates ND11 and ND12, and then the NAND gate ND14 outputs a low-level PMOS sensing enable signal PPS in response to the output signal of the NAND gate ND13 and the sensing enable signal PSE. That is, after the NMOS sensing enable signal PNS is first changed from a high-level signal to a low-level signal, the PMOS sensing enable signal PPS is changed from a high-level signal to a low-level signal following the delay time of the delay unit 411.

The buffer unit 412 buffers the low-level PMOS sensing enable signal PPS, thereby generating a low-level PMOS drive activation signal LAPG. The buffer unit 422 buffers and inverts the low-level NMOS sensing enable signal PNS, thereby generating a high-level delayed NMOS drive activation signal LANG.

As a result, in the self-refresh mode, the NMOS drive activation signal LANG is first activated, and then the PMOS drive activation signal LAPG is activated after the delay time of the delay unit 411 has elapsed. Accordingly, in the sense amplifier SA, the NMOS sense amplifier NSA first performs the sensing operation and then the PMOS sense amplifier PSA performs the sensing operation, creating the presensing period of the NMOS sense amplifier NSA.

Further, when the sensing enable signal PSE is inactivated to a low level, the output signal of the NAND gate ND12 is kept at a high level by the low-level inverted self-refresh enable signal PSELF, while the output signal of the NAND gate ND21 is changed to a high-level signal by the high-level self-refresh enable signal PSELF and the low-level sensing enable signal PSE. Thereafter, when the low-level sensing enable signal PSE is delayed by the delay units 411 and 412 and then applied to each of the NAND gates ND11 and ND22, the output signal of the NAND gate ND22 is kept at a high level by the low-level inverted self-refresh enable signal PSELF, while the output signal of the NAND gate ND11 is delayed by the high-level self-refresh enable signal PSELF and the low-level delayed sensing enable signal PSE and changed to a high-level signal. The NAND gate ND23 outputs a low-level signal in response to the output signals of the WAND gates ND21 and ND22, and the NAND gate ND24 outputs a high-level NMOS sensing enable signal PNS in response to the output signal of the NAND gate ND23 and the sensing enable signal PSE. In contrast, the NAND gate ND13 outputs a low-level delayed signal in response to the output signals of the NAND gates ND11 and ND12, and the NAND gate ND14 outputs a high-level PMOS sensing enable signal PPS in response to the output signal of the NAND gate ND13 and the sensing enable signal PSE. Accordingly, both the PMOS sensing enable signal PPS and the NMOS sensing enable signal PNS are simultaneously inactivated.

The buffer unit 412 buffers the high-level PMOS sensing enable signal PPS, thereby generating a high-level PMOS drive activation signal LAPG. The buffer unit 422 buffers and inverts the high-level NMOS sensing enable signal PNS, thereby generating a low-level NMOS drive activation signal LANG.

As a result, the sense amplifier controller 400-1 shown in FIG. 2 presenses the PMOS sense amplifier in the normal read mode, and presenses the NMOS sense amplifier in the self-refresh mode.

Figure 4:
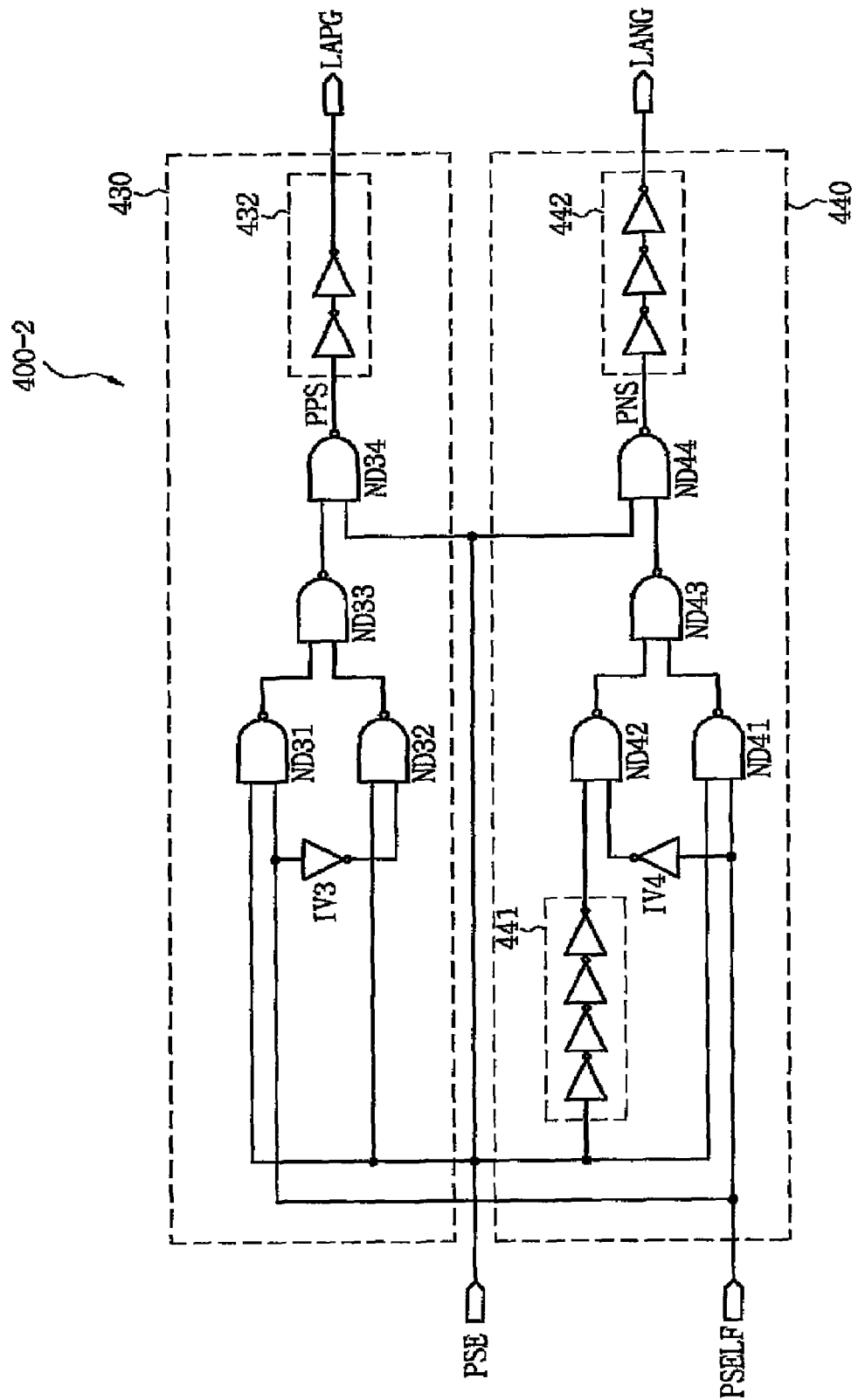
FIG. 4 is a diagram showing another example of a sense amplifier controller shown in FIG. 1, according to an illustrative embodiment.
Figure 5:
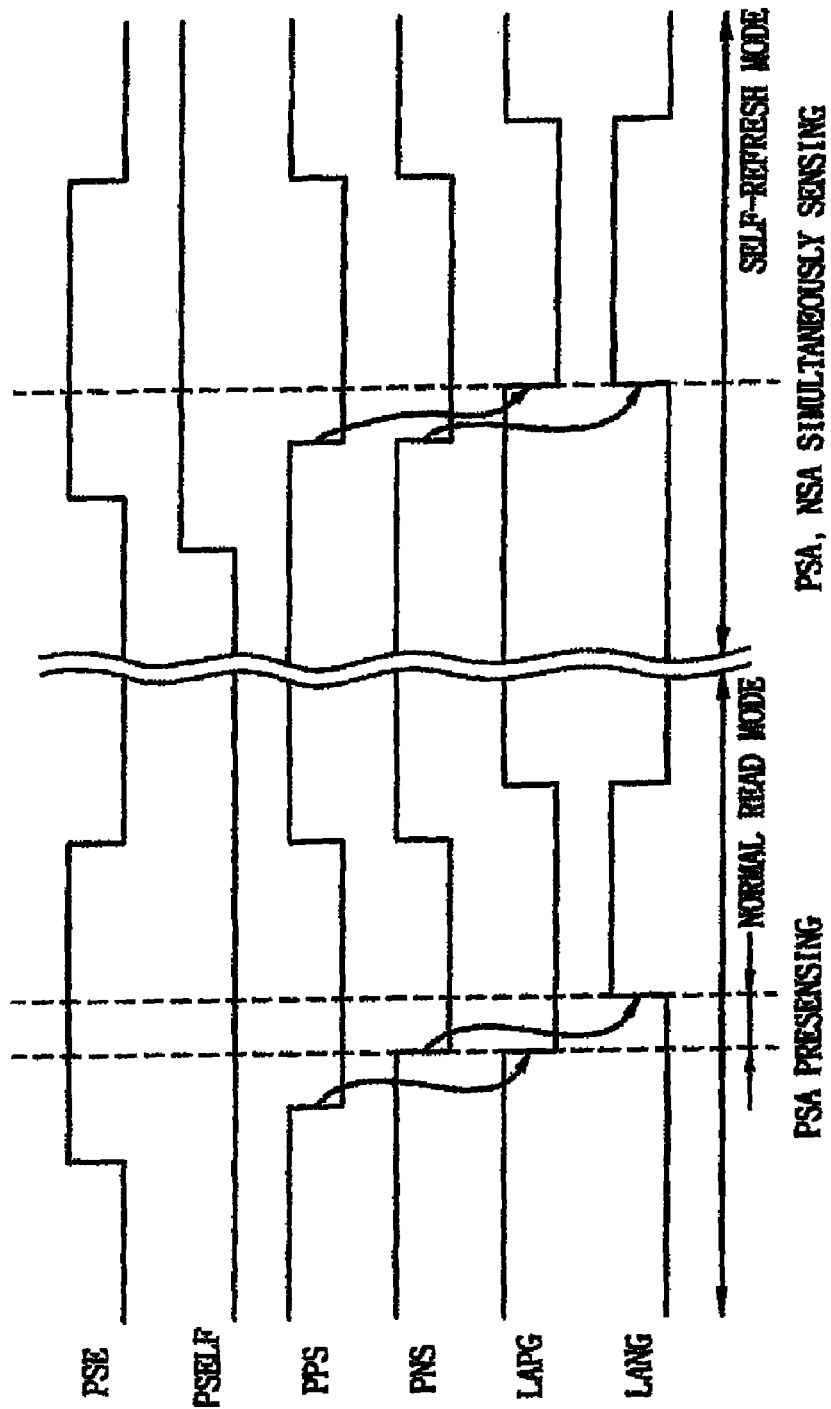
FIG. 5 is a timing diagram illustrating operation of the sense amplifier controller shown in FIG. 4, according to an illustrative embodiment.

FIG. 4 is a diagram showing another example of the sense amplifier controller shown in FIG. 1, according to an illustrative embodiment FIG. 5 is a timing diagram illustrating operation of the sense amplifier controller shown in FIG. 4, according to an illustrative embodiment.

The sense amplifier controller 400-2 shown in FIG. 4 has substantially the same structure as the sense amplifier controller 400-1 shown in FIG. 2, without the delay unit 411. That is, the NMOS drive activation signal generator 440 shown in FIG. 4 has substantially the same structure as the NMOS drive activation signal generator 420 shown in FIG. 2, including a delay unit 441, an inverter IV4, four NAND gates ND41 to ND44, and a buffer unit 442. Similarly, the PMOS drive activation signal generator 430 shown in FIG. 4 has substantially the same structure as the PMOS drive activation signal generator 410 shown in FIG. 2, including an inverter IV3, four NAND gates ND31 to ND34, and a buffer unit 432, but does not include a delay unit, such as delay unit 411.

Operation of the sense amplifier controller 400-2 is described with reference to FIGS. 4 and 5 below. In the normal read mode, the sense amplifier controller 400-2 shown in FIG. 4 operates the same as the sense amplifier controller 400-1 shown in FIG. 2. That is, in the normal read mode, the PMOS drive activation signal LAPG is first activated and then the NMOS drive activation signal LANG is activated after the delay time of the delay unit 441 has elapsed. Accordingly, in the sense amplifier SA, the PMOS sense amplifier PSA first performs the sensing operation and then the NMOS sense amplifier NSA performs the sensing operation, creating the presensing period of the PMOS sense amplifier PSA. Furthermore, when the read operation is terminated, both the PMOS sensing enable signal PPS and the NMOS sensing enable signal PNS are simultaneously inactivated.

In contrast, in the self-refresh mode, since the PMOS drive activation signal generator 430 does not include a delay unit, such as the delay unit 411 of the PMOS drive activation signal generator 410 in FIG. 2, the high-level sensing enable signal PSE is not delayed when applied to the NAND gate ND31. Therefore, the PMOS sensing enable signal PPS is activated (as well as inactivated) simultaneously with the NMOS sensing enable signal PNS, resulting in simultaneous generation of activated PMOS drive activation signal LAPG and NMOS drive activation signal LANG, as shown in FIG. 5.

As a result, the sense amplifier controllers 400-1 and 400-2 shown in FIGS. 2 and 4 are able to control the sensing timing of the sense amplifier SA. That is, the sensing timing of the NMOS sense amplifier NSA and the sensing timing of the PMOS sense amplifier PSA are controlled in different ways, according to whether the semiconductor memory device enters the normal read mode or the self-refresh mode. Further, while only the normal read mode and the self-refresh mode have been described as examples, the semiconductor memory device may have various other modes, in which case the sensing timing of the sense amplifier SA may be controlled in additional ways, according to the various modes.

Although the above description involves a DRAM device, embodiments of the inventive concept may be applied to various other types of semiconductor memory devices including sense amplifiers. Further, construction of the sense amplifier and the sense amplifier controller may be altered in various ways, and the activation or inactivation level of each signal may also be altered, without departing from the spirit and scope of the present teachings.

According to a semiconductor memory device and a method of controlling a sense amplifier of the semiconductor memory device, the sensing timing of an NMOS sense amplifier and the sensing timing of a PMOS sense amplifier are controlled in different ways according to operational mode, improving operational characteristics of the semiconductor memory device.

While various illustrative embodiments have been described, it will be apparent to those skilled in the art that various changes and modifications may be made without departing from the spirit and scope of the present inventive concept. Therefore, it should be understood that the above embodiments are not limiting, but illustrative.

What is claimed is:

1. A semiconductor memory device, comprising:
    at least one sense amplifier including a PMOS sense amplifier and an NMOS sense amplifier configured to be respectively activated in response to a first supply voltage and a second supply voltage, and to sense and amplify a voltage difference between a corresponding bit line pair;
    a controller configured to set one of a normal read mode and a self-refresh mode in response to an external command, to control activation timing of a PMOS drive activation signal and an NMOS drive activation signal according to the set operating mode, and to output the PMOS drive activation signal and the NMOS drive activation signal; and
    a sense amplifier driver configured to apply the first and second supply voltages to the PMOS and NMOS sense amplifiers, respectively, in response to the PMOS drive activation signal and the NMOS drive activation signal,
    wherein, in the normal read mode, the activation timing of the PMOS drive activation signal is before the activation timing of the NMOS drive activation signal, and in the self-refresh mode, the activation timing of the PMOS drive activation signal is after or the same as the activation timing of the NMOS drive activation signal.

2. The semiconductor memory device of claim 1, wherein the controller activates a sensing enable signal when the operating mode is the normal read mode, and activates the sensing enable signal and a self-refresh enable signal when the operating mode is the self-refresh mode.

3. The semiconductor memory device of claim 2, wherein the controller comprises:
    a sense amplifier controller configured to adjust the activation timing of the PMOS drive activation signal and the NMOS drive activation signal and to output the PMOS drive activation signal and the NMOS drive activation signal in response to the sensing enable signal and the self-refresh enable signal.

4. The semiconductor memory device of claim 3, wherein the sense amplifier controller comprises:
    a PMOS drive activation signal generator configured to activate the PMOS drive activation signal in response to the sensing enable signal and the self-refresh enable signal; and
    an NMOS drive activation signal generator configured to activate the NMOS drive activation signal in response to the sensing enable signal and the self-refresh enable signal.

5. The semiconductor memory device of claim 4, wherein the sense amplifier controller activates the PMOS drive activation signal before the NMOS drive activation signal when the sensing enable signal is activated and the self-refresh enable signal is inactivated, and activates the NMOS drive activation signal before the PMOS drive activation signal when both the sensing enable signal and the self-refresh enable signal are activated.

6. The semiconductor memory device of claim 4, wherein the sense amplifier controller activates the PMOS drive activation signal before the NMOS drive activation signal when the sensing enable signal is activated and the self-refresh enable signal is inactivated, and simultaneously activates both the PMOS drive activation signal and the NMOS drive activation signal when both the sensing enable signal and the self-refresh enable signal are activated.

7. The semiconductor memory device of claim 4, wherein the sense amplifier controller simultaneously inactivates both the PMOS drive activation signal and the NMOS drive activation signal when the sensing enable signal is inactivated.

8. The semiconductor memory device of claim 1, wherein the sense amplifier driver comprises:
    PMOS drive transistors configured to apply the first supply voltage to the PMOS sense amplifier in response to the PMOS drive activation signal; and
    NMOS drive transistors configured to apply the second supply voltage to the NMOS sense amplifier in response to the NMOS drive activation signal.

9. The semiconductor memory device of claim 1, further comprising:
    a memory cell array including memory cells that are arranged between a plurality of bit line pairs and between a plurality of word lines.

10. A method of controlling a sense amplifier of a semiconductor memory device comprising at least one sense amplifier including a PMOS sense amplifier and an NMOS sense amplifier configured to be respectively activated when a first supply voltage and a second supply voltage are applied to sense and amplify a voltage difference between a corresponding bit line pair, the method comprising:
    setting one of a normal read mode and a self-refresh mode in response to an external command;
    controlling activation timing of a PMOS drive activation signal and an NMOS drive activation signal according to the set mode; and
    driving the sense amplifier by respectively applying the first and second supply voltages to the PMOS sense amplifier and the NMOS sense amplifier in response to the PMOS drive activation signal and the NMOS drive activation signal,
    wherein, in the normal read mode, an activation timing of the PMOS drive activation signal is before an activation timing of the NMOS drive activation signal, and in the self-refresh mode, the activation timing of the PMOS drive activation signal is after or the same as the activation timing of the NMOS drive activation signal.

11. The method of claim 10, wherein controlling the activation timing of the PMOS drive activation signal and the NMOS drive activation signal comprises:

activating a sensing enable signal when the operating mode is the normal read mode, and activating both the sensing enable signal and a self-refresh enable signal when the operating mode is the self-refresh mode; and adjusting the activation timing of the PMOS drive activation signal and the NMOS drive activation signal and outputting the PMOS drive activation signal and the NMOS drive activation signal in response to the sensing enable signal and the self-refresh enable signal.

12. The method of claim 11, wherein controlling the activation timing of the PMOS drive activation signal and the NMOS drive activation signal comprises:

activating the PMOS drive activation signal before the NMOS drive activation signal when the sensing enable signal is activated and the self-refresh enable signal is inactivated, and activating the NMOS drive activation signal before the PMOS drive activation signal when both the sensing enable signal and the self-refresh enable signal are activated.

13. The method of claim 11, wherein controlling the activation timing of the PMOS drive activation signal and the NMOS drive activation signal comprises:

activating the PMOS drive activation signal before the NMOS drive activation signal when the sensing enable signal is activated and the self-refresh enable signal is inactivated, and simultaneously activating the PMOS drive activation signal and the NMOS drive activation signal when both the sensing enable signal and the self-refresh enable signal are activated.

14. The method of claim 11, wherein controlling the activation timing of the PMOS drive activation signal and the NMOS drive activation signal comprises:

simultaneously inactivating the PMOS drive activation signal and the NMOS drive activation signal when both the sensing enable signal and the self-refresh enable signal are inactivated.

15. The method of claim 10, wherein driving the sense amplifier comprises:

driving the PMOS sense amplifier by applying the first supply voltage to the PMOS sense amplifier in response to the PMOS drive activation signal; and driving the NMOS sense amplifier by applying the second supply voltage to the NMOS sense amplifier in response to the NMOS drive activation signal.

* * * * *